US006686066B2

United States Patent
Kwon et al.

(10) Patent No.: US 6,686,066 B2
(45) Date of Patent: Feb. 3, 2004

(54) LIGHT-EMITTING COMPOUND AND DISPLAY DEVICE ADOPTING LIGHT-EMITTING COMPOUND AS COLOR-DEVELOPING SUBSTANCE

(75) Inventors: Soon-ki Kwon, Chinju (KR); Yun-hi Kim, Pusan (KR); Dong-cheol Shin, Chinju (KR); Jun-hwan Ahn, Kwangju (KR); Han-sung Yu, Anyang (KR); Jung-hyun Lee, Suwon (KR)

(73) Assignee: Samsung Display Devices Co., Ltd., Suwon (KR)

( * ) Notice: Subject to any disclaimer, the term of this patent is extended or adjusted under 35 U.S.C. 154(b) by 0 days.

(21) Appl. No.: 10/289,182

(22) Filed: Nov. 7, 2002

(65) Prior Publication Data

US 2003/0099864 A1 May 29, 2003

Related U.S. Application Data

(62) Division of application No. 09/351,163, filed on Jul. 12, 1999, now Pat. No. 6,506,504.

(30) Foreign Application Priority Data

Nov. 12, 1998 (KR) ............................................. 98-48402

(51) Int. Cl.$^7$ ............................................. H05B 33/14
(52) U.S. Cl. ...................... 428/690; 428/917; 428/704; 313/504; 313/506; 257/40; 257/103; 252/301.16; 252/301.35
(58) Field of Search ................................. 428/690, 704, 428/917; 313/504, 506; 257/40, 103; 252/301.16, 301.35

(56) References Cited

U.S. PATENT DOCUMENTS 5,759,709 A  6/1998  Doi et al.

OTHER PUBLICATIONS

Kim et al.; (Chem. Mater. 1997, 9. 2699–2701).
"Development and Application of Electroluminescent Device", The Collection of Papers of the Macromolecular Chemical Symposium, vol. 11(3), 1998.
Ahn et al., "EL polymer containing silicon 1, 3, 4–oxadiazole in main chain, and optical characteristics thereof", Abstracts, vol. 23, No. 2, Oct. 1998.

Primary Examiner—Deborah Jones
Assistant Examiner—Ling X Xu
(74) Attorney, Agent, or Firm—Leydig, Voit & Mayer, Ltd.

(57) ABSTRACT

A light-emitting compound and a display device adopting the light-emitting compounds as a color-developing substance. When the display device adopts an organic layer formed of the light-emitting compound, such as a light-emitting layer or an electron transport layer, as a blue light-emitting material, it can display blue and has good luminous efficiency and driving voltage characteristics.

3 Claims, 3 Drawing Sheets

LIGHT-EMITTING COMPOUND AND DISPLAY DEVICE ADOPTING LIGHT-EMITTING COMPOUND AS COLOR-DEVELOPING SUBSTANCE

This application is a divisional of U.S. application Ser. No. 09/351,163, filed on Jul. 12, 1999, now U.S. Pat. No. 6,506,504.

BACKGROUND OF THE INVENTION

1. Field of the Invention

The present invention relates to a blue light-emitting compound and a display device adopting the light-emitting compound as a color-developing substance.

2. Description of the Related Art

Recent advances in the information and communications industries have increased the need for high performance display devices. Generally, display devices are classified into luminous types and non-luminous types. Luminous type display devices include cathode ray tube (CRT) and light emitting diode (LED), and non-luminous type display device include liquid crystal display (LCD).

As an index of the basic performance of the display device, there are operating voltage, power consumption, luminance, contrast, response time, life span and display color, among others.

The LCD, as one of the non-luminous type display device, has been most favored recently, due to its light weight and low power consumption. However, characteristics such as response time, contrast and viewing angle properties are unsatisfactory, leaving room for improvement. Meanwhile, an electro-luminescence (EL) device has been focused as a next generation display device which can solve such problems.

The EL device as a spontaneous luminous type display has a broad viewing angle, a good contrast characteristic and a rapid response time. The EL device is classified into an inorganic EL device and an organic EL device depending on the material used for a light-emitting layer. In particular, the organic EL device has good luminance, driving voltage and response time characteristic and can display a multitude of colors, compared to the inorganic EL device.

FIG. 1 is a section view showing the structure of a general EL device. Referring to FIG. 1, an anode 12 is formed on a substrate 11. A hole transport layer 13, a light-emitting layer 14, an electron transport layer 15, and a cathode 16 are formed on the anode 12 in sequence. Here, the hole transport layer 13, the light-emitting layer 14 and the electron transport layer 15 are organic thin films formed of an organic compound.

The organic EL device having the above structure operates based on the following operation principle. When a voltage is applied between the anode 12 and the cathode 16, holes injected from the anode 12 move through the hole transport layer 13 to the light-emitting layer 14. Meanwhile, electrons are injected from the cathode 16 through the electron transport layer 15 to the light-emitting layer 14. Also, carriers are recoupled in the light-emitting layer 14 to generate excitons. The excitons are transited from an excited state to a ground state, so that fluorescent molecules of the light-emitting layer emit light to form a picture.

Also, an organic EL device adopting an aromatic diamine and aluminum complex having a low molecular weight has been developed by Eastman Kodak Company (*Appl. Phys. Lett.* 51, 913, 1987)

In addition, an organic EL device adopting a polymer such as poly(p-phenylenevinylene) (PPV) or poly(2-methoxy-5-(2'-ethylhexyloxy)-1,4-phenylenevinylene) as a material for a light-emitting layer has been disclosed (*Nature*, 347, 539, 1990, and *Appli. Phys. Lett.* 58, 1982, 1991). However, PPV among the polymers has a poor solubility in an organic solvent, so that it is difficult to adopt a spin-coating so as to form a film by spin-coating method. To solve this problem, a soluble PPV having a functional group capable of improving its solubility in an organic solvent has been developed. The organic EL device having a light-emitting layer formed of PPV or a derivative of the PPV displays a multitude of colors from green to orange.

Also, the well-known blue light-emitting compound is low in luminous efficiency compared to another color of light-emitting compound, thus a need for a new blue light-emitting compound having a high luminous efficiency has increased.

Accordingly, a compound having a non-conjugative spacer group such as silicon (Si) or oxygen (O) between luminous groups of PPV, as a blue light-emitting compound, has been suggested. However, a light-emitting layer formed of the light-emitting compounds is not satisfactory in characteristics such as a film strength.

SUMMARY OF THE INVENTION

It is an object of the present invention to provide a new blue light-emitting compound capable of solving the problems.

It is another object of the present invention to provide a display device adopting the blue light-emitting compound as a color-developing substance.

To achieve the first object of the present invention, there is provided a light-emitting compound represented by the chemical formula (1):

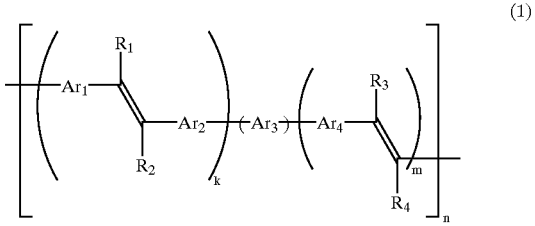

wherein $Ar_1$, $Ar_2$, and $Ar_4$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $Ar_3$, unsubstituted or substituted fused aromatic ring, is selected from the group consisting of unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted fluorene, unsubstituted or substituted carbazole, unsubstituted or substituted benzothiophene, and unsubstituted or substituted dibenzofuran; $R_1$, $R_2$, $R_3$ and $R_4$ are independently selected from the group consisting of hydrogen, ethyleneoxy group, $C_1$–$C_{20}$ alkyl group, $C_1$–$C_{20}$ alkoxy group, aryl group, trimethylsilyl group, and trimethylsilylaryl group; k and m are independently 0 or 1; and n is an integer from 10 to 200.

The second object of the present invention is achieved by a display device adopting the light-emitting compounds as a color-developing substance. Preferably, the display device is an organic electro-luminescence (EL) device adopting the light-emitting compounds as a color-developing substance.

To achieve the second object of the present invention, there is provided an organic electro-luminescence device comprising an organic layer between a pair of electrodes, wherein the organic layer comprises a light-emitting compound represented by the chemical formula (1):

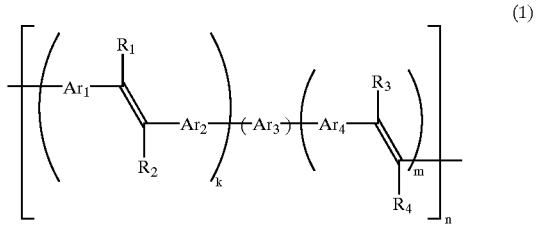

(1)

wherein $Ar_1$, $Ar_2$, and $Ar_4$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $Ar_3$, unsubstituted or substituted fused aromatic ring, is selected from the group consisting of unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted fluorene, unsubstituted or substituted carbazole, unsubstituted or substituted benzothiophene, and unsubstituted or substituted dibenzofuran; $R_1$, $R_2$, $R_3$ and $R_4$ are independently selected from the group consisting of hydrogen, ethyleneoxy group, $C_1$–$C_{20}$ alkyl group, $C_1$–$C_{20}$ alkoxy group, aryl group, trimethylsilyl group, and trimethylsilylaryl group; k and m are independently 0 or 1; and n is an integer from 10 to 200.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
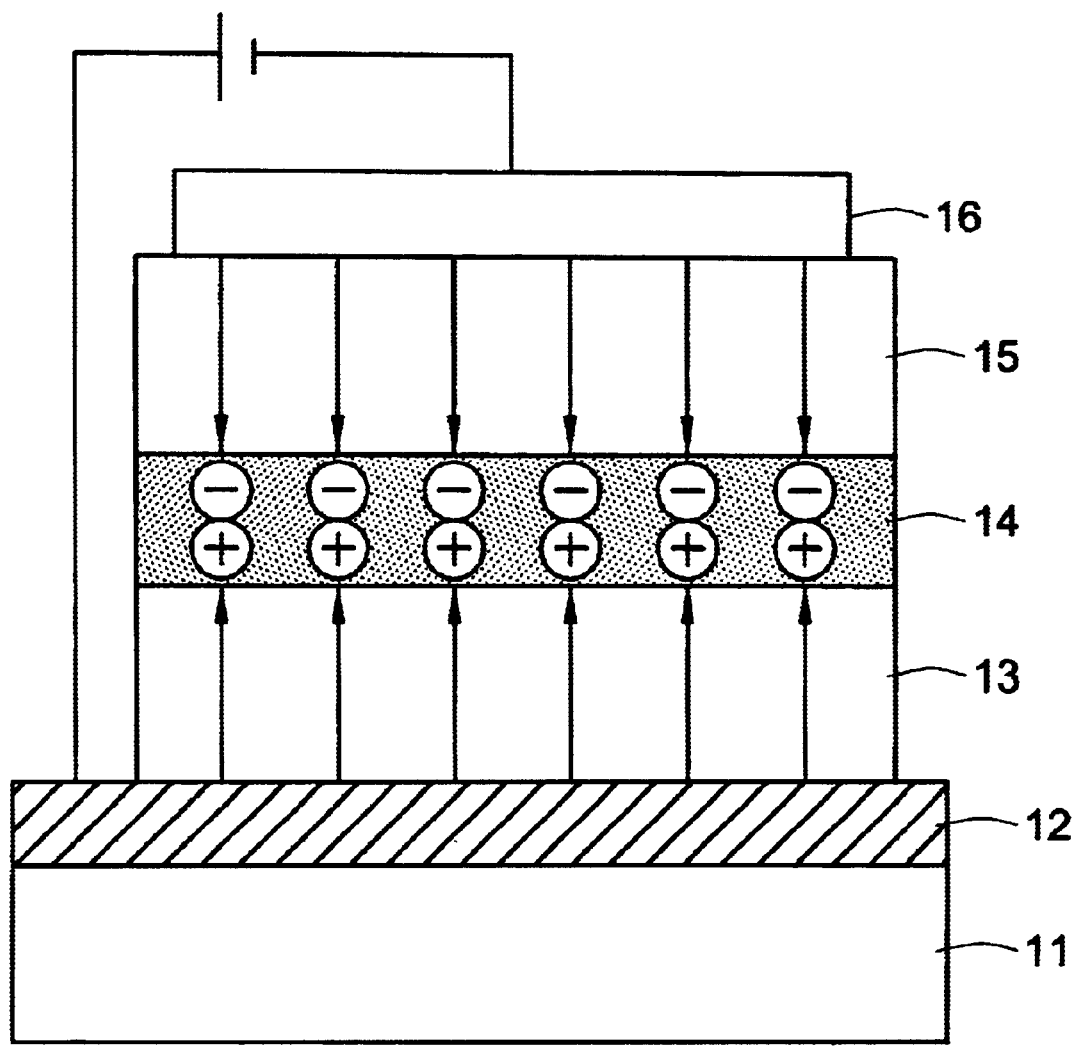
FIG. 1 is a section view showing the structure of a general organic electro-luminescence (EL) device.

A light-emitting compound according to the present invention, represented by the following chemical formula (1), has a fused aromatic ring $Ar_3$. Due to the fused aromatic ring, quantum efficiency becomes approximate 1. Accordingly, luminous efficiency of the compound represented by the formula (1) is good.

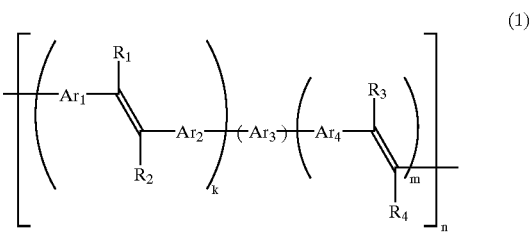

(1)

In the chemical formula (1), $Ar_1$, $Ar_2$, and $Ar_4$ are independently selected from the group consisting of chemical bond, unsubstituted or substituted phenyl, unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted biphenyl, unsubstituted or substituted fluorene, unsubstituted or substituted carbazole, unsubstituted or substituted thiophene, unsubstituted or substituted pyridine, unsubstituted or substituted oxadiazole, unsubstituted or substituted oxazole, unsubstituted or substituted triazole, unsubstituted or substituted benzothiophene, unsubstituted or substituted dibenzofuran, and unsubstituted or substituted thiadiazole; $Ar_3$, unsubstituted or substituted fused aromatic ring, is selected from the group consisting of unsubstituted or substituted naphthalene, unsubstituted or substituted anthracene, unsubstituted or substituted diphenylanthracene, unsubstituted or substituted phenanthrene, unsubstituted or substituted indene, unsubstituted or substituted acenaphthene, unsubstituted or substituted fluorene, unsubstituted or substituted carbazole, unsubstituted or substituted benzothiophene, and unsubstituted or substituted dibenzofuran; $R_1$, $R_2$, $R_3$ and $R_4$ are independently selected from the group consisting of hydrogen, ethyleneoxy group, $C_1$–$C_{20}$ alkyl group, $C_1$–$C_{20}$ alkoxy group, aryl group, trimethylsilyl group, and trimethylsilylaryl group; k and m are independently 0 or 1; and n is an integer from 10 to 200.

In the chemical formula (1), the example of the substituted phenyl includes methoxyphenyl, methylphenyl, triphenylsilylphenyl and ethylhexyloxyphenyl, the example of the substituted naphthalene includes methoxynaphthalene and phenylnaphthalene, the example of the substituted anthracene includes phenylanthracene, the example of the substituted diphenylanthracene includes 2-phenoxy-9,10-diphenylanthracene, the example of the substituted phenanthrene includes phenylphenanthrene, the example of the substituted indene includes dihexylindene, the example of the substituted acenaphthene includes phenylacenaphthene, the example of the substituted biphenyl includes methoxybiphenyl and phenoxybiphenyl, the example of the substituted fluorene includes dimethylfluorene, diethylfluorene, dipropylfluorene, dibutylfluorene, dipentylfluorene, dihexylfluorene, diheptylfluorene, dioctylfluorene, dinonylfluorene, didecylfluorene, didodecylfluorene and diphenyl fluorene, the example of the substituted carbazole includes N-ethylhexylcarbazole, the example of the substituted thiophene includes 5-phenylthiophene, the example of the substituted pyridine includes phenylpyridine, the example of the substituted oxadiazole includes phenyloxadiazole and diphenyloxadiazole, the example of the substituted oxazole includes benzooxazole, the example of the substituted triazole includes 2,5-dipheyl-1-(3'-trifluoromethylphenyl) triazole, the example of the substituted benzothiophene includes phenylbenzothiophene, the example of the substituted dibenzofuran includes phenyldibenzofuran, and the example of the substituted thiadiazole includes phenylthiadiazole and diphenyithiadiazole.

For example, the compound represented by the chemical formula (1) according to the present invention may be compound represented by chemical formula (2), wherein $Ar_1$ is a single bond, $Ar_2$ and $Ar_4$ are phenyl groups, $Ar_3$ is represented by the following structural formula:

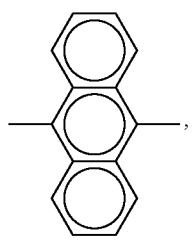

$R_1$ is triphenylsilylphenyl group, $R_2$, $R_3$ and $R_4$ are all hydrogen, and k and m are both 1, or compound represented by the chemical formulae (3), wherein $R_1$ are phenyl groups, $Ar_3$ is represented by the following structural formula:

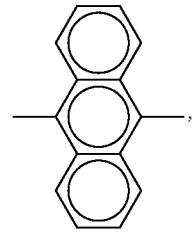

$R_2$ is hydrogen, and m is 0.

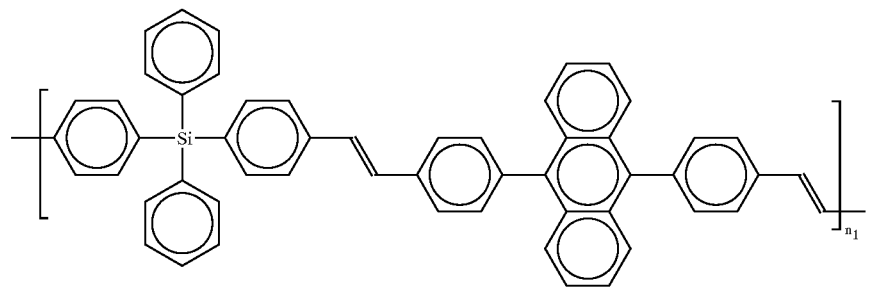

(2)

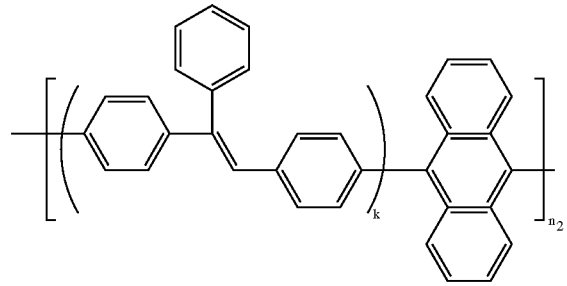

(3)

In the formulae (2) and (3), $n_1$ and $n_2$ are each integer from 10 to 200, and $k_1$ is 0 or 1.

Preferably, the compound represented by the formula (1) according to the present invention has a molecular weight of $5\times10^3 \sim 2\times10^5$. This is because luminous efficiency is good in this molecular weight range of the compound of the formula (1). The compound represented by the formula (1) may be used to form an organic layer, preferably, a light-emitting layer and a hole transport layer.

Hereinafter, a method for manufacturing an organic EL device according to the present invention will be described.

First, a material for an anode is coated on a substrate. Here, the substrate is a substrate used for a general organic EL device, preferably, a glass substrate or a transparent plastic substrate which is good in transparency, surface smoothness, convenience in handling and waterproofing characteristic. Also, indium tin oxide (ITO), tin oxide ($SnO_2$) or zinc oxide (ZnO), which is good in transparency and conductivity, is used as a material for the anode.

A hole transport layer is formed on the anode electrode. The compound of the formula (1) is spin-coated on the hole transport layer to form a light-emitting layer.

Then, a metal for forming a cathode is deposited over the light-emitting layer in a vacuum, to form a cathode, thereby completing an organic EL device. Here, the material for the cathode may be lithium (Li), magnesium (Mg), aluminum (Al), an Al—Li alloy, calcium (Ca), a magnesium-indium (Mg—In) alloy or a magnesium-silver (Mg—Ag) alloy.

Here, an electron transport layer may be formed before the cathode is formed on the light-emitting layer. The electron transport layer is formed of a general material for an electron transport layer.

The material for the hole transport layer is not limited to a specific material. Preferably, the material for the hole transport layer is the compound of the formula (1), polyvinylcarbazole (PVK) or PDPMA represented by the following structural formula:

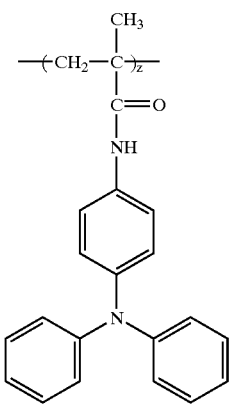

The organic EL device according to the present invention may further comprise an intermediate layer for improving characteristics of the device, between two layers selected from the anode, the hole transport layer, the light-emitting layer, the electron transport layer and the cathode. For example, a buffer layer may be formed between the anode and the hole transport layer. Such buffer layer decreases contact resistance between the anode and the hole transport layer, and simultaneously improves the transport ability of holes from the anode to the light-emitting layer, thereby improving overall characteristics of the device.

A material for the buffer layer is not limited to a specific material. However, preferably, the material for the buffer layer is polyethylene dioxythiophene (PEDT) or polyaniline.

The organic EL device is formed by stacking in sequence the anode, the hole transport layer, the light-emitting layer, the electron transport layer and the cathode as above. Alternatively, the order of stacking the respective layers may be reversed such that the cathode, the electron transport layer, the light-emitting layer, the hole transport layer and the anode are stacked in sequence.

Figure 2:
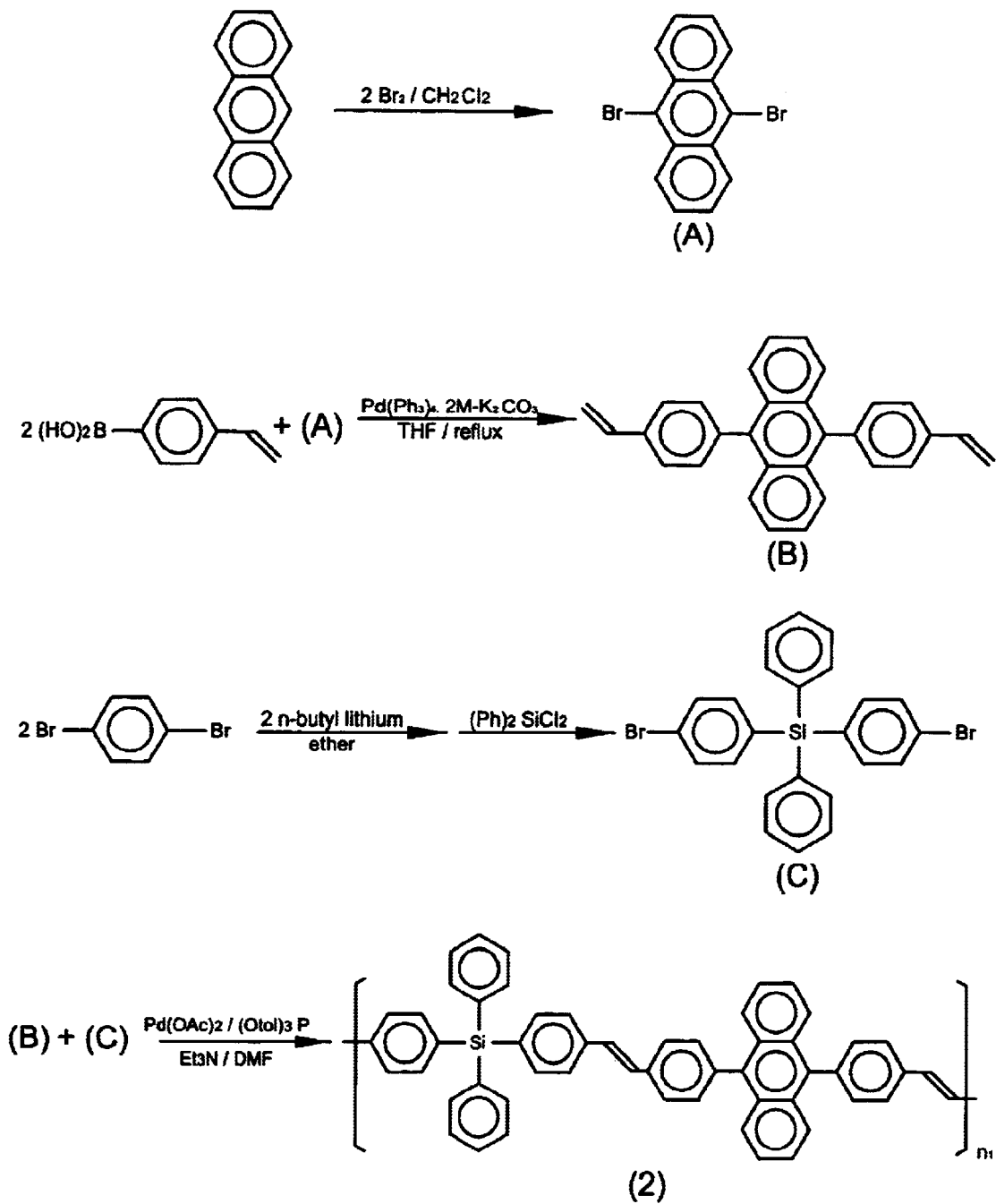
FIGS. 2 and 3 illustrate the process of synthesizing the compounds represented by chemical formulae (2) and (3).
Figure 3:
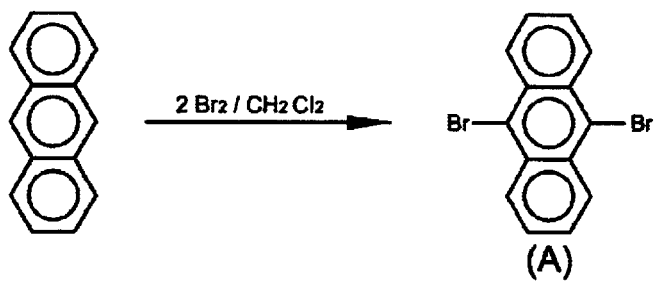
Figure 3:
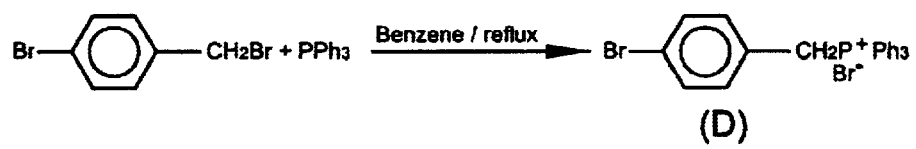
Figure 3:
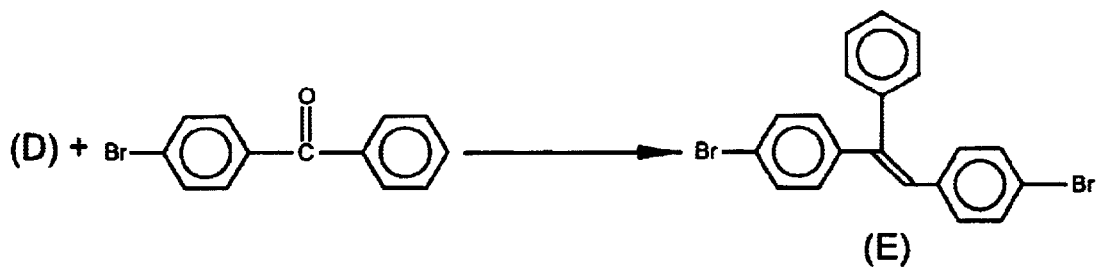
Figure 3:
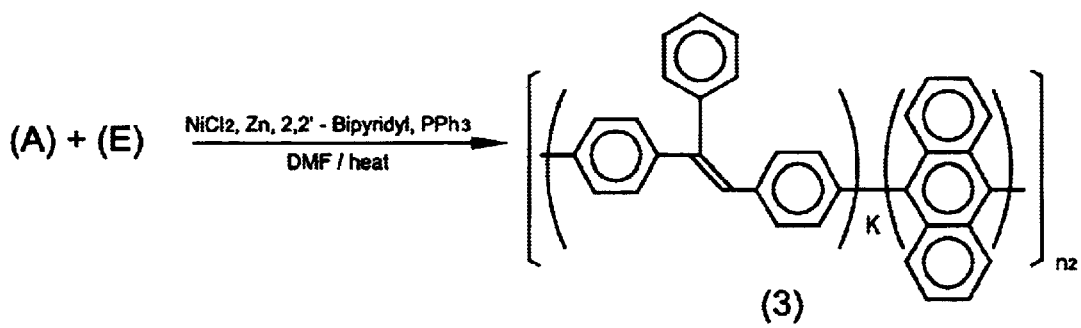

FIGS. 2 and 3 illustrate the process of synthesizing the compounds represented by the formulae (2) and (3). Hereinafter, the present invention will be described in detail through the following examples with reference to FIGS. 2 and 3. However, the present invention is not limited to the following examples.

SYNTHESIS EXAMPLE 1

Compound of the Formula (2) (See FIG. 2)

Anthracene was dissolved in methylene chloride, and then the temperature of the reaction mixture was adjusted to $-5°$ C. 2 equiv. of bromine was added drop-wise into the reaction mixture, and the mixture was then stirred at room temperature for 12 hours, resulting in a compound (A) (see FIG. 2) (yield: 85%). Tetrahydrofuran (THF) was added to the compound (A), and tetrakis (triphenylphosphine)palladium and potassium carbonate ($K_2CO_3$) were added to the mixture, and then the mixture was refluxed for 24 hours, resulting in a compound (B) (yield: 60%).

In addition, 1,4-dibromobenzene was dissolved in diethyl ether, and the temperature of the mixture was adjusted to $-40°$ C. n-butyl lithium was added drop-wise into the reaction mixture, and then stirred at room temperature for 2 hours. Then, the temperature of the reaction mixture was adjusted to $-78°$ C., and 1 equiv. of diphenyldichlorosilane was added drop-wise to the mixture at the same temperature. The reaction mixture was stirred at room temperature for 12 hours, resulting in a compound (C) (yield: 78%).

The compound (B) was dissolved in N,N-dimethyl formamide (DMF), and then the compound (C), palladium (II) diacetate ($(CH_3CO_2)_2Pd$), (o-tolyl)$_3$P and triethylamine were added to the solution. The resulting reaction mixture was heated to 100° C., and then reacted at the same temperature for 40 hours.

After the reaction was completed, methanol was added to the reaction mixture for precipitation. The resulting precipitate was dissolved in chloroform, and then methanol was added to the solution for re-precipitation. The resulting precipitate was filtered and dried to attain the compound of the formula (2) (yield: 85%). In the formula (2), $n_1$ is an integer from 10 to 200.

SYNTHESIS EXAMPLE 2

Compound of the Formula (3) (See FIG. 3)

Anthracene was dissolved in methylene chloride, and then the temperature of the reaction product was adjusted to $-5°$ C. 2 equiv. of bromine was added drop-wise into the reaction mixture, and the mixture was then stirred at room temperature for 12 hours, resulting in 9,9'-dibromoanthracene (A) (yield: 85%).

In addition, 4-bromobenzyl bromide and 1 equiv. of triphenylphosphine were dissolved in benzene and then refluxed for 12 hours, resulting in a compound (B) (yield: 95%).

Then, 4-bromobenzophenone was added to the compound (B) for the Wittig reaction, resulting in a compound (C) (yield: 60%).

Anhydrous nickel (II) chloride ($NiCl_2$), 2,2'-bipyridine, triphenyl phosphine and zinc (Zn) powder were put in a 3-neck round bottomed flask. The flask was purged with argon (Ar) gas about ten times. Anhydrous DMF was added to the reaction mixture, and the temperature of the reaction mixture was adjusted to 50° C. The reaction mixture was stirred for 30 minutes, the compounds (A) and (C) were rapidly added to the reaction mixture under nitrogen gas atmosphere, and then the temperature of the mixture was adjusted to 90° C. The reaction mixture was stirred for 24 hours, resulting in the compound represented by the formula (3) (yield: 60%). In the formula (3), $n_2$ is an integer from 10 to 200 and $k_1$ is 1.

EXAMPLE 1

After forming an electrode of ITO on a glass substrate, a composition for forming a light-emitting layer was spin-coated on the ITO electrode to form a light-emitting layer having a thickness of 800 Å. The composition for the light-emitting layer was prepared by dissolving 0.1 g of the compound of the formula (2) in 5 g of dichloromethane. Then, Al and Li were simultaneously vapor-deposited on the light-emitting layer in a vacuum, to form an Al—Li electrode having a thickness of 1,200 Å, resulting in an organic EL device.

EXAMPLE 2

An organic EL device was manufactured by the same method as in Example 1, except that the compound of the formula (3) was used instead of the compound of the formula (2) to form a light-emitting layer.

EXAMPLE 3

After forming an electrode of ITO on a glass substrate, a composition for forming a light-emitting layer was spin-coated on the ITO electrode to form a light-emitting layer having a thickness of 800 Å. The composition for the light-emitting layer was prepared by dissolving 0.1 g of the compound of the formula (2) in 5 g of dichloromethane.

Then, tris(8-quinolinol) aluminum (Alq) represented by the following formula (4) was deposited on the light-emitting layer in a vacuum, to form an electron transport layer having a thickness of 200 Å.

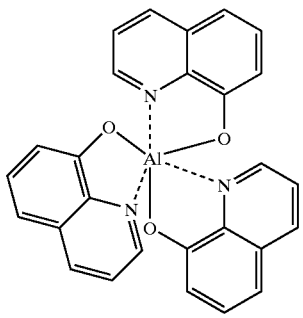

(4)

Then, Al and Li were simultaneously vapor-deposited on the electron transport layer in a vacuum, to form an Al—Li electrode having a thickness of 1,200 Å, resulting in an organic EL device.

EXAMPLE 4

An organic EL device was manufactured by the same method as in Example 3, except that the compound of the formula (3) was used instead of the compound of the formula (2) to form a light-emitting layer.

EXAMPLE 5

After forming an electrode of ITO on a glass substrate, poly(p-phenylenevinylene) (PPV) was spin-coated on the ITO electrode, to form a hole transport layer having a thickness of 400 Å.

Then, the compound of the formula (2) was spin-coated on the hole transport layer to form a light-emitting layer having a thickness of 800 Å.

Then, Al and Li were simultaneously vapor-deposited on the light-emitting layer in a vacuum, to form an Al—Li electrode having a thickness of 1,200 Å, resulting in an organic EL device.

Turn-on voltage, luminance and color characteristics of the organic EL devices manufactured in Examples 1 through 5 were measured, and the results are tabulated in Table 1.

TABLE 1

| classification | turn-on voltage (V) | luminance at 15 V (cd/m$^2$) | color (EL λ max) |
|---|---|---|---|
| Example 1 | 7 | 1,500 | blue (465 nm) |
| Example 2 | 6 | 1,500 | blue (450 nm) |
| Example 3 | 9 | 2,500 | blue (450 nm) |
| Example 4 | 8 | 2,000 | blue (450 nm) |
| Example 5 | 5 | 1,000 | blue (450 nm) |

As can be understood from Table 1, the organic EL devices manufactured in Examples 1 through 5 displayed blue. Also, the turn-on voltage was 10V or less, which is nearly equal to or less than the case of using a general blue luminous material, and the luminance was improved.

Also, the film strength of the light-emitting layer for the organic EL devices manufactured in Examples 1 through 5 was measured.

As a result, in the organic EL devices manufactured in Examples 1 through 5, the light-emitting layer had good film strength.

The light-emitting compound of the formula (1) according to the present invention, as a blue luminous material, is useful as a color-developing material for a display. The organic EL device according to the present invention, adopting an organic layer, such as a light-emitting layer or a hole transport layer, formed of the compound of the formula (1) can display blue and exhibits good luminous efficiency and driving voltage characteristics.

What is claimed is:

1. A light-emitting compound represented by the chemical formula (3):

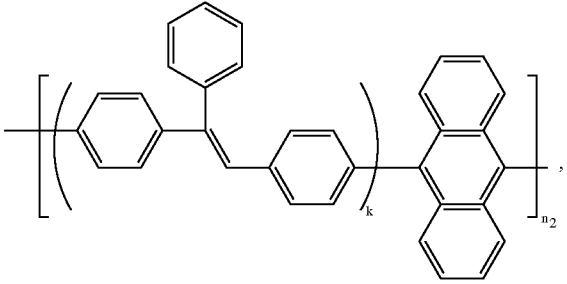

(3)

wherein k is 1 and n$_2$ is 10 to 200.

2. An organic electro-luminescence device comprising an organic layer between a pair of electrodes, wherein the organic layer comprises a light-emitting compound represented by the chemical formula (3) of claim 1.

3. A display device adopting the light-emitting compound claimed in claim 1 as a color developing substance.

* * * * *